(12) United States Patent
Hsu

(10) Patent No.: US 8,785,277 B2
(45) Date of Patent: Jul. 22, 2014

(54) METHOD OF MANUFACTURING THE TRENCH POWER SEMICONDUCTOR STRUCTURE

(75) Inventor: Hsiu-Wen Hsu, Hsinchu County (TW)

(73) Assignee: Super Group Semiconductor Co., Ltd., New Taipei (TW)

( * ) Notice: Subject to any disclaimer, the term of this patent is extended or adjusted under 35 U.S.C. 154(b) by 127 days.

(21) Appl. No.: 13/617,645

(22) Filed: Sep. 14, 2012

(65) Prior Publication Data
US 2013/0330895 A1    Dec. 12, 2013

(30) Foreign Application Priority Data
Jun. 8, 2012    (TW) .............................. 101120749 A

(51) Int. Cl.
*H01L 21/336*    (2006.01)
*H01L 27/148*    (2006.01)

(52) U.S. Cl.
USPC ........... 438/268; 438/269; 438/270; 257/220; 257/330

(58) Field of Classification Search
USPC .......... 438/268–270, 273; 257/220, 329, 330, 257/341
See application file for complete search history.

(56) References Cited

U.S. PATENT DOCUMENTS

2007/0173021 A1*    7/2007    Kocon et al. .................. 438/270

* cited by examiner

*Primary Examiner* — Hsien Ming Lee
(74) *Attorney, Agent, or Firm* — Li & Cai Intellectual Property (USA) Office

(57) ABSTRACT

A method of manufacturing a trench power semiconductor structure is provided. The method comprising the steps of: providing a base, forming a dielectric pattern layer on the base to define an active region and a terminal region, wherein a portion of the base in the active region and the terminal region is covered by the dielectric pattern layer; selectively forming a first epitaxial layer on the base without being covered by the dielectric pattern layer; removing the dielectric pattern layer in the active region to form a gate trench on the base, and forming a gate dielectric layer on the first epitaxial layer and on the inner surface of the gate trench; forming the gate structure in the gate trench; utilizing the dielectric pattern layer to forming a body on or in the first epitaxial layer; and forming a source on the upper portion of the body.

12 Claims, 10 Drawing Sheets

METHOD OF MANUFACTURING THE TRENCH POWER SEMICONDUCTOR STRUCTURE

BACKGROUND

1. Technical Field

The invention relates to a method of manufacturing power semiconductor structure, and in particular the method of manufacturing the trench power semiconductor structure.

2. Description of Related Art

With the higher requirement of energy conservation, the higher energy conversion efficiency is needed. The requirement of the design specification becomes stricter day by day, and thus it is a big challenge to the designer of the power converter device. In order to meet this requirement, the power converter device in the high converter efficiency becomes more and more important, wherein the power metal-oxide-semiconductor field effect transistor (Power MOSFET) is one of the most widely used in the power converter devices.

In the traditional planar MOSFET, the current is flowing along with the base surface. On the other hand, in the trench MOSFET, the gate is set in the trench, and the channel position of the MOSFET is changed, so as to make the current of the MOSFET is flowing perpendicular to the base. Hereby, the size of the element is reduced, and the motivation of the element is promoted, so as to reduce the manufacturing cost. The process of manufacturing traditional trench MOSFET needs at least six masking processes (lithography processes), wherein two masking processes are utilized to form the source and the body. In the initial stage of element development, the cost of the masking process is very expensive. Besides, the time wasting and the error in the process of manufacturing MOSFET might also increase the manufacturing cost.

Nowadays, in the semiconductor market, the competition advantage of the price is very important, and thus, searching for a simple manufacturing method to reduce the complication of the process and promote the competition advantage of the price without affecting the efficiency of the element is an important issue in this technical field.

SUMMARY

Accordingly, the present invention provides a method of manufacturing the trench power semiconductor structure. First, the dielectric pattern layer is formed in the active region and the terminal region. Then, a first epitaxial layer is selectively formed on the base without being covered by the dielectric layer. Next, the dielectric pattern layer in the active region is removed, and the dielectric pattern layer in the terminal region is remained to act as the mask for forming the body and the source. Thus, one of the mask processes might be omitted to reduce the high manufacturing cost and the manufacturing error in the process of mask alignment.

According to the method of manufacturing the trench power semiconductor in present invention, only five masks are needed in the process from the base to the passivation layer, so as to reduce the manufacturing cost entirely and further promote the competition advantage in the price.

The present invention provides a method of manufacturing the trench power semiconductor structure which comprising the following steps: first, providing a base; then, forming a dielectric pattern layer on the base to defined an active region and a terminal region, wherein a portion of the base in the active region and the terminal region is covered by the dielectric pattern layer; next, selectively forming a first epitaxial layer on the base without being covered by the dielectric pattern layer; then, removing the dielectric pattern layer in the active region to form a gate trench on the base; after that, forming a gate dielectric layer on the first epitaxial layer and the inner surface of the gate trench, and forming a gate structure in the gate trench; finally, utilizing the dielectric pattern layer in the terminal region as the mask to form a body on or in the first epitaxial layer, and form a source on the upper portion of the body.

In order to further appreciate the characteristic and technical contents of the instant disclosure, references are hereunder made to the detailed descriptions and appended drawings in connection with the instant disclosure. However, the appended drawings are merely shown for exemplary purpose rather being used to restrict the scope of the instant disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

First Embodiment

Figure 1A:
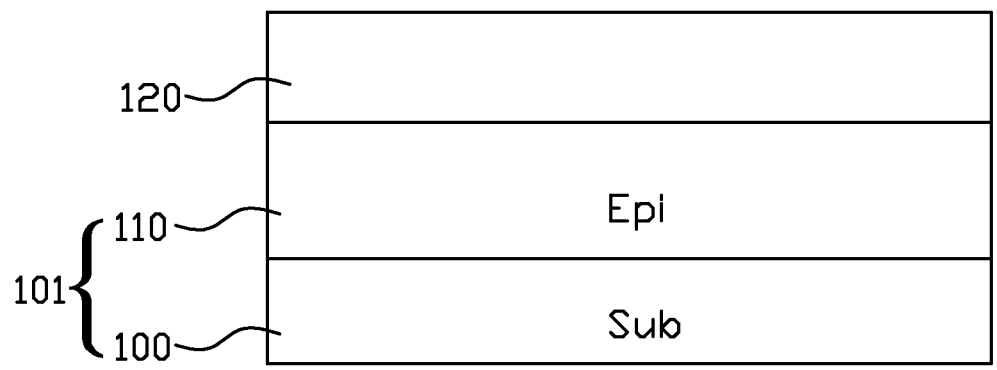
FIG. 1A through FIG. 1G illustrate the method of manufacturing the trench power semiconductor structure according to the first embodiment of present invention.

FIG. 1A to FIG. 1G illustrate the method of manufacturing the trench power semiconductor structure according to the first embodiment of present invention. As shown in the FIG. 1A, firstly, a base 101 is provided, which comprises a substrate 100 and an epitaxial layer 110. Then, a dielectric layer 120 is formed on the base 101. The dielectric layer 120 is deposited on the epitaxial layer 110, for example, but the present invention is not limited thereto. For example, the dielectric layer 120 can be form on the epitaxial layer 110 by using an oxidation manner. Next, the photolithography process is proceeded to form a dielectric pattern layer 120' on the base 101, and thus to define an active region 102 and a terminal region 103 on the base 101. As shown in the FIG. 1B, only a portion of the epitaxial layer 110 in the active region 102 is covered by the dielectric pattern layer 120', and all of the epitaxial layer 110 in the terminal region 103 is covered by the dielectric pattern layer 120'.

In this embodiment, the epitaxial layer 110 is formed on the substrate 100 by using an epitaxial growth manner. The substrate 100 might be silicon substrate, while the material of the substrate and conductivity type of the dopant of the substrate are not limited thereto. On the other hand, the epitaxial layer"

110 might even be omitted, which means that the base is being the substrate and the following processes are proceeded to the substrate.

Figure 1B:
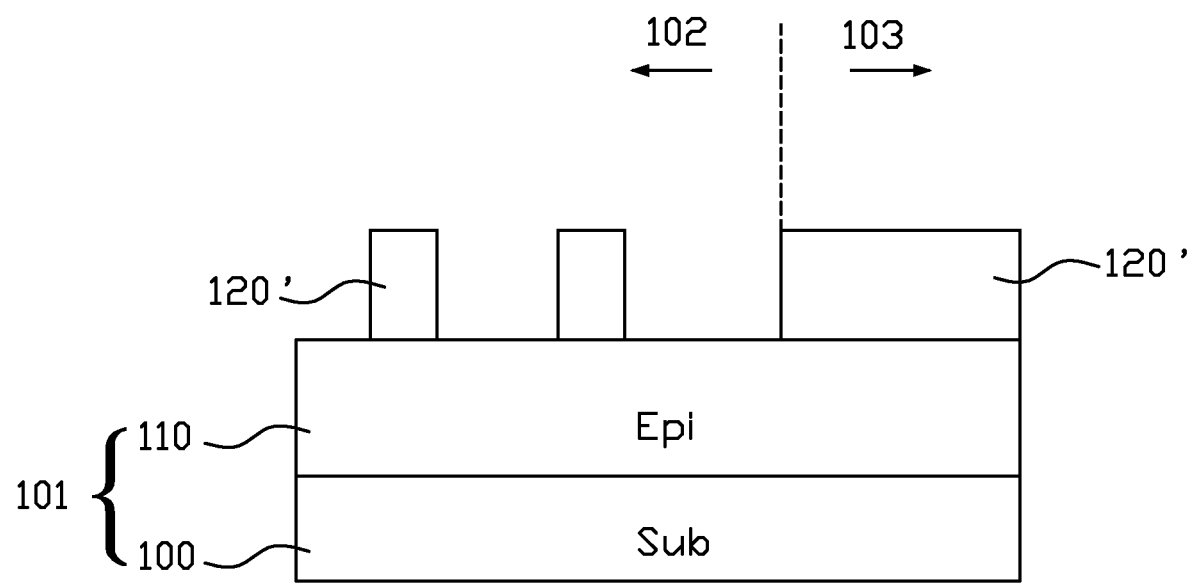
Figure 1C:
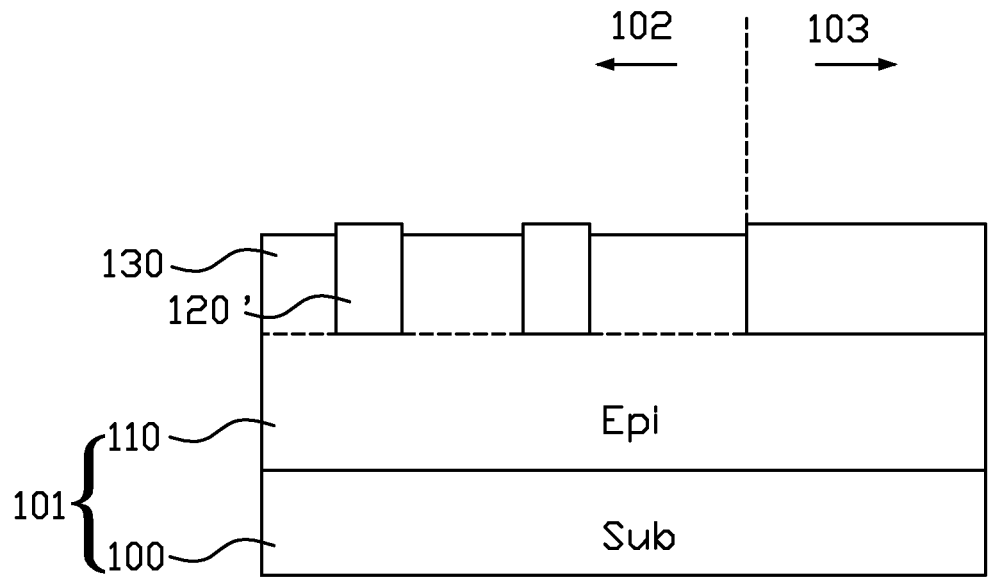

Next, as shown in the FIG. 1C, a first epitaxial layer 130 is selectively formed on the base 101. The first epitaxial layer 130 is formed on the epitaxial layer 110 without being covered by the dielectric pattern layer 120' in the active region 102. The first epitaxial layer 130 may be formed by the selective epitaxial growth technique. In this embodiment, the conductivity type of the first epitaxial layer 130 and the base 101 are the same. The thickness of the first epitaxial layer 130 is lower than that of the dielectric pattern layer 120', or alternatively, the thickness of the first epitaxial layer 130 might be equal to that of the dielectric pattern layer 120' (not shown in FIG. 1C).

Figure 1D:
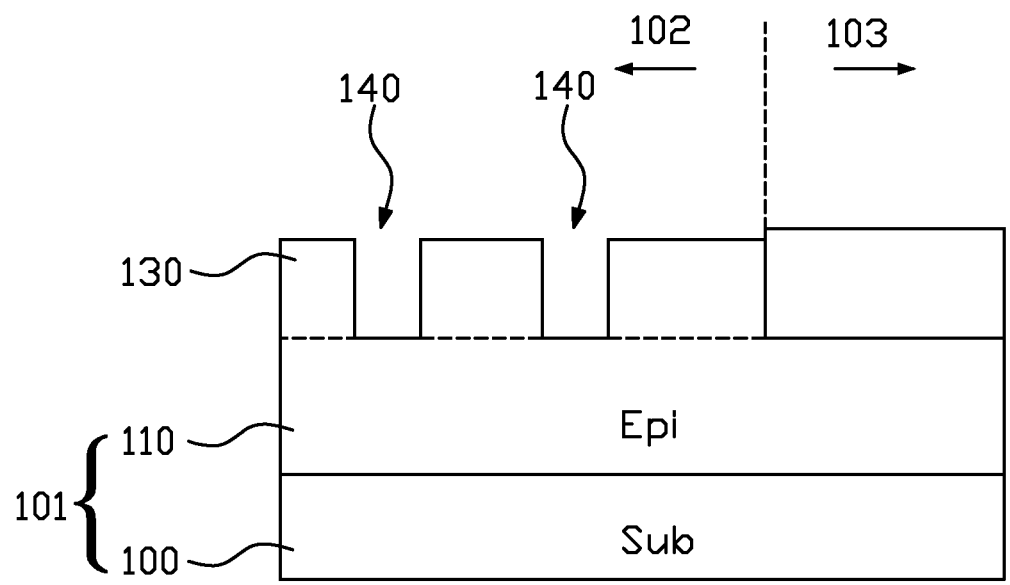
Figure 1E:
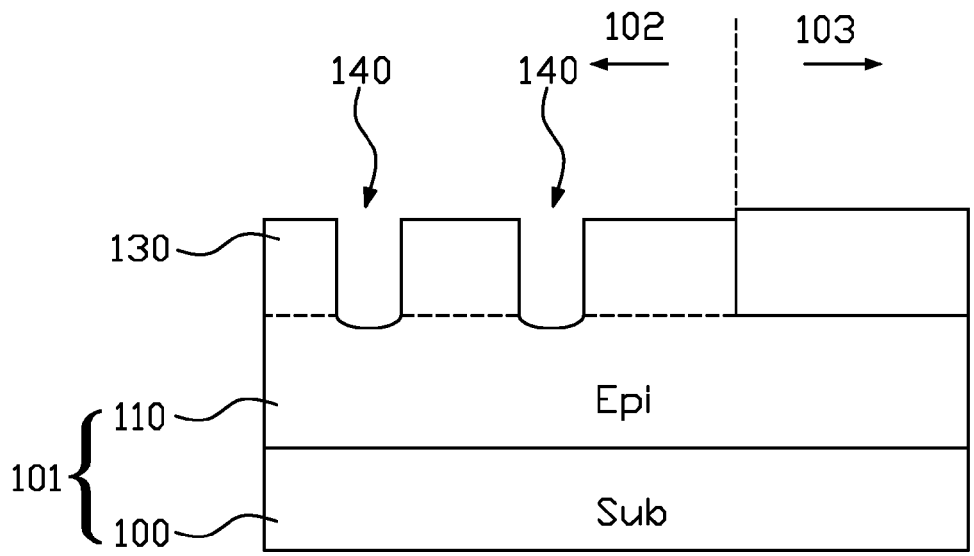

After that, as shown in FIG. 1D, the photolithography process is proceeded to remove the dielectric pattern layer 120' in the active region 102, so as to form a gate trench 140 on the base 101. In order to uniform the thickness of the gate dielectric layer which grows in the following processes, at the next step, as shown in the FIG. 1E, the bottom of the trench is etched to round the bottom of the gate trench 140. Then, the sacrificial oxide layer (not shown in FIG. 1E) is formed to recover the surface of the epitaxial layer. Next, the sacrificial oxide layer is removed. In this embodiment, the step shown in the FIG. 1E might be omitted, and the following processes can be proceeded directly.

Figure 1F:
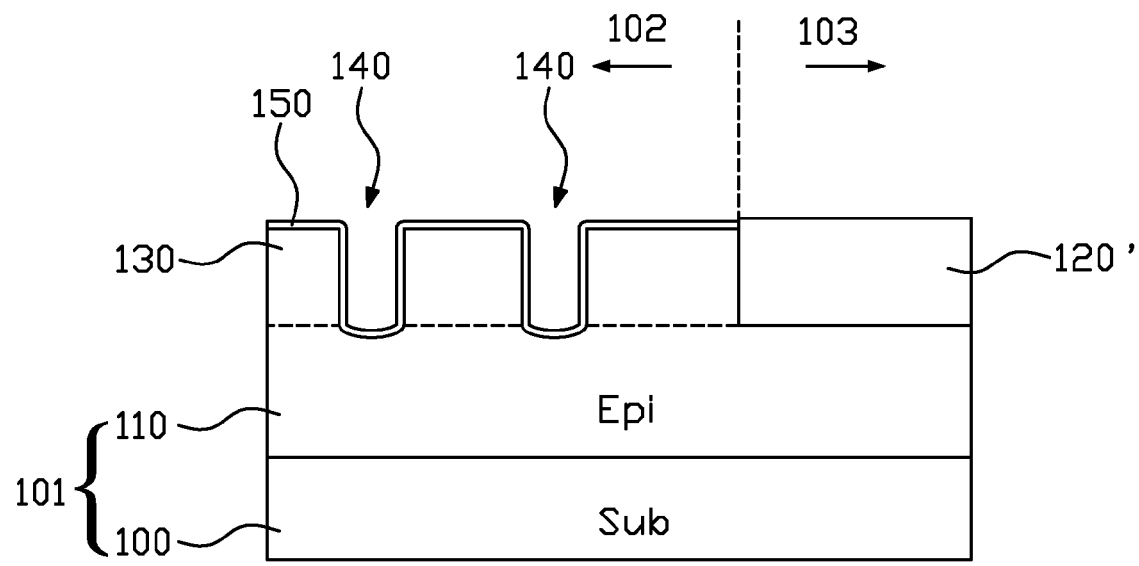

Subsequently, as shown in the FIG. 1F, the gate dielectric layer 150 is formed on the first epitaxial layer 130 and in the gate trench 140. By using a thermal oxidation manner, the gate dielectric layer 150 becomes the silicon oxide on the first epitaxial layer 130 without being covered by the dielectric pattern layer 120' and on the inner surface of the gate trench 140. Besides, the gate dielectric layer 150 may be formed on the first epitaxial layer 130, in the gate trench 140 and on the dielectric pattern layer 120' by using the chemical vapor deposition manner. Practically, the silicon dioxide or other relative high dielectric material might be utilized to form the gate dielectric layer 150.

Figure 1G:
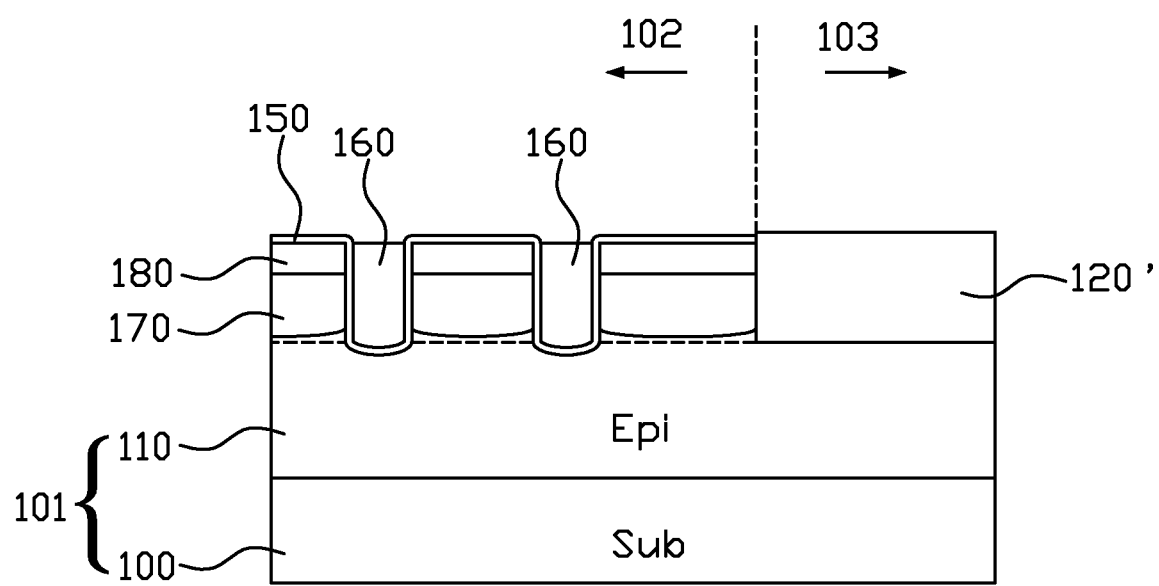

Finally, as shown in the FIG. 1G, the poly silicon is deposited on the base 101, and a gate structure 160 is formed in the gate trench 140 by using an etching-back manner. Then, the dielectric pattern layer 120' and the gate structure 160 in the terminal region are utilized as a mask to form a body 170 in the first epitaxial layer 130. Next, a source 180 is formed on the upper portion of the body 170. In this embodiment, the body 170 and the source 180 in the first epitaxial layer 130 are formed by using an ion implantation manner.

Second Embodiment

Furthermore, in order to obtain a lower gate-drain capacitance (Cgd), the bottom dielectric structure is formed under the gate trench according to the structure variation of the above-mentioned dielectric pattern layer 120'. The practical implementation is shown in FIG. 2A through FIG. 2E, which illustrate the method of manufacturing the trench power semiconductor structure according to the second embodiment of present invention.

Figure 2A:
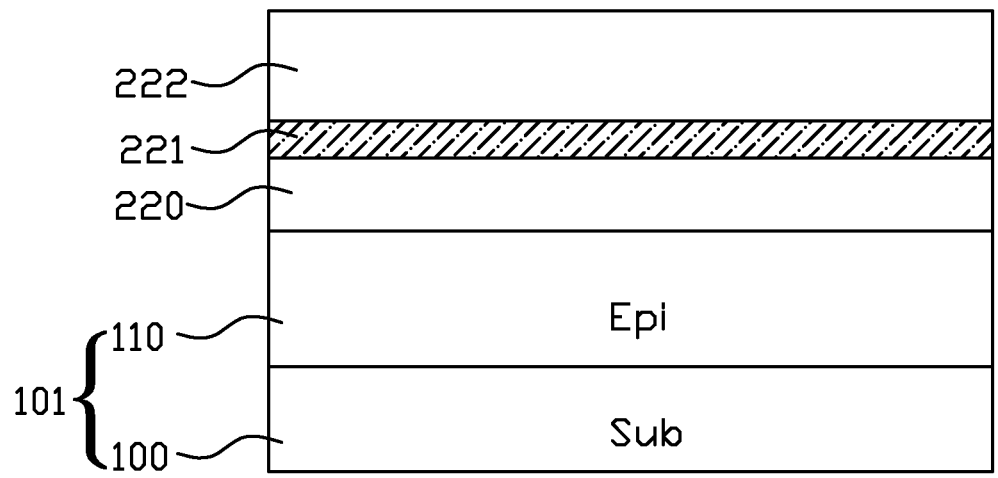
FIG. 2A through FIG. 2E illustrate the method of manufacturing the trench power semiconductor structure according to the second embodiment of present invention.

As shown in the FIG. 2A, first of all, the epitaxial layer 110 is formed on the base 100. Then, a dielectric layer is formed on the base 100, wherein the dielectric layer comprises a bottom dielectric layer 220, an isolating layer 221 and a shielding layer 222. The silicon nitride would be selected as the material of the above-mentioned isolating layer 221 and the present invention is not limited thereto. The material of the isolating layer 221 should be different from that of the bottom dielectric layer 220 and the shielding layer 222. Besides, the material of the oxide can be selected as the material of the bottom dielectric layer 220 and the shielding layer 222. However, the present invention isn't limited thereto under the condition that the material of the shielding layer 222 is different from that of the isolating layer 221.

Figure 2B:
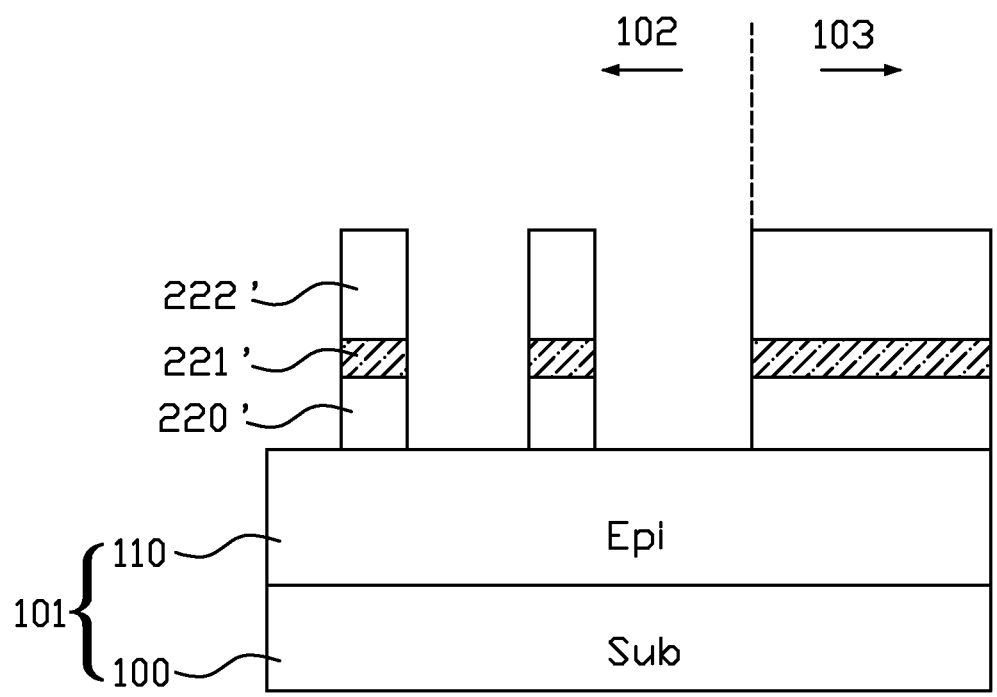
Figure 2C:
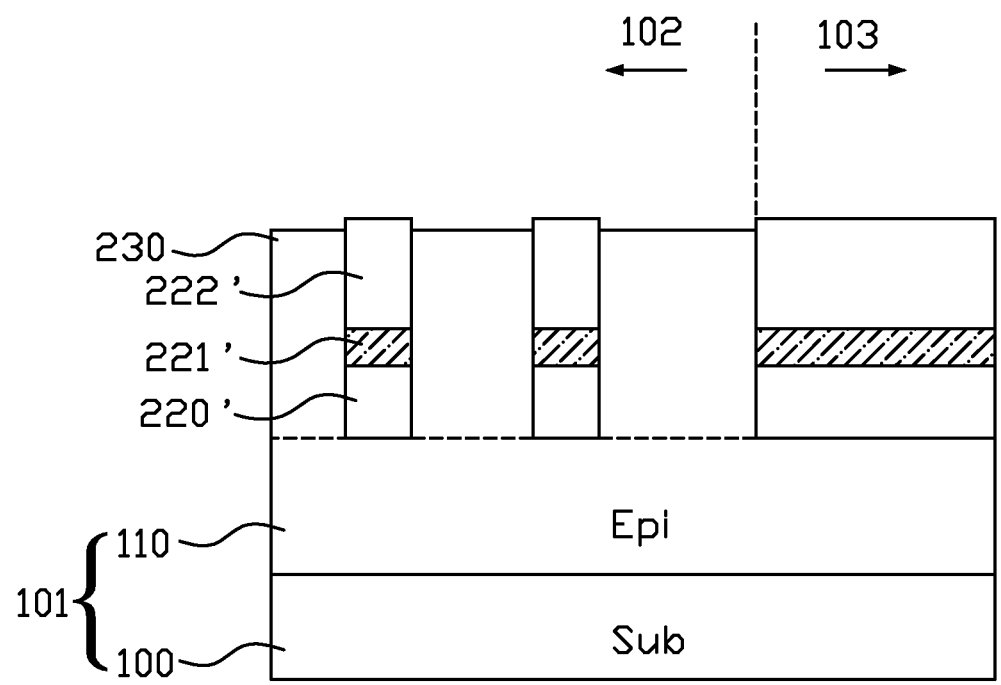

Next, as shown in the FIG. 2B, the photolithography process is proceeded to form the dielectric pattern layer on the epitaxial layer 110, the above-mentioned dielectric pattern layer comprises a bottom dielectric structure 220', an isolating structure 221' and a shielding structure 222'. After that, as shown in the FIG. 2C, a first epitaxial layer 230 is selectively formed on the epitaxial layer 110 without being covered by the dielectric pattern layer.

Figure 2D:
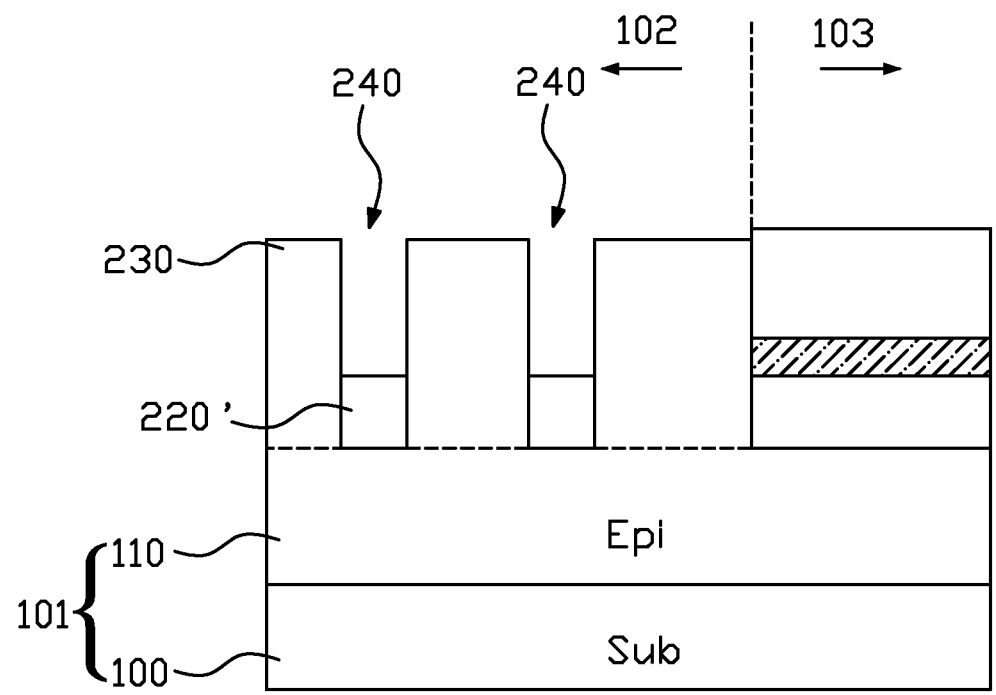

As shown in the FIG. 2D, after the photolithography process is proceeded, the shielding structure 222' in the active region 102 is removed by using a selectively etching process. Then, by using another one selectively etching process, the isolating structure 221' is removed, and only the bottom dielectric structure 220' is retained on the epitaxial layer 110, so as to form a gate trench 240 on the bottom dielectric structure 220'.

Figure 2E:
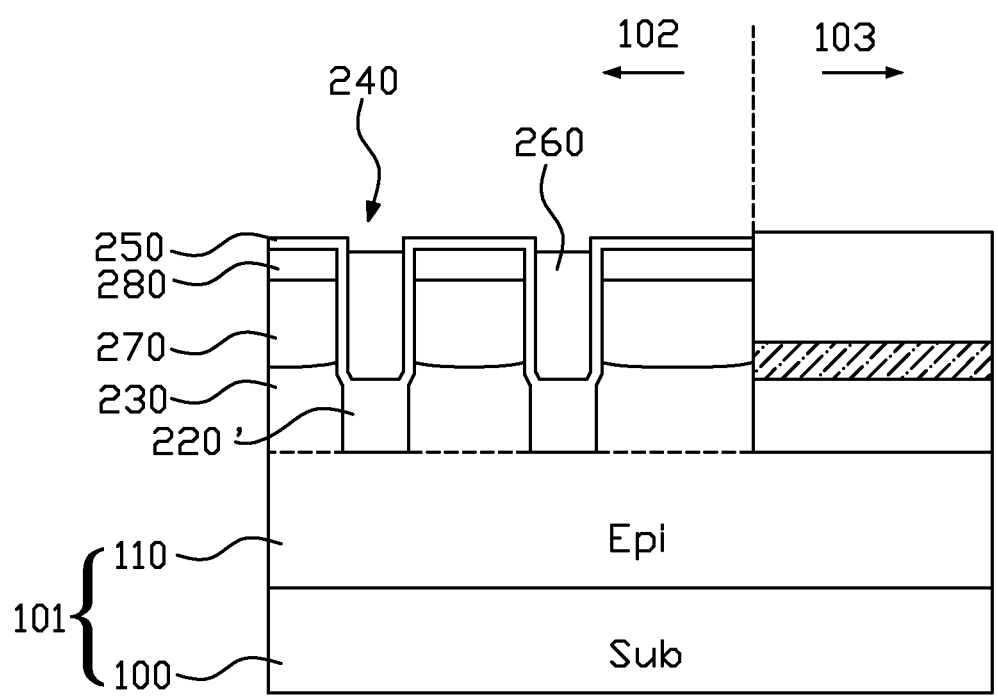

Finally, as shown in the FIG. 2E, a gate dielectric layer 250 is formed on the first epitaxial layer 230 and in the inner surface of the gate trench 240. Next, a gate structure 260 is formed in the gate trench 240. Then, the dielectric pattern layer in the terminal region 103 and the gate structure 260 are utilized as the mask to form a body 270 in the first epitaxial layer 230, wherein the depth of the body 270 should be smaller than that of the gate trench 240. After that, a source 280 is formed on the upper portion of the body 270. In this embodiment, the dielectric pattern layer in the terminal region 103 comprises the bottom dielectric structure 220', the isolating structure 221' and the shielding structure 222'.

Third Embodiment

Figure 3A:
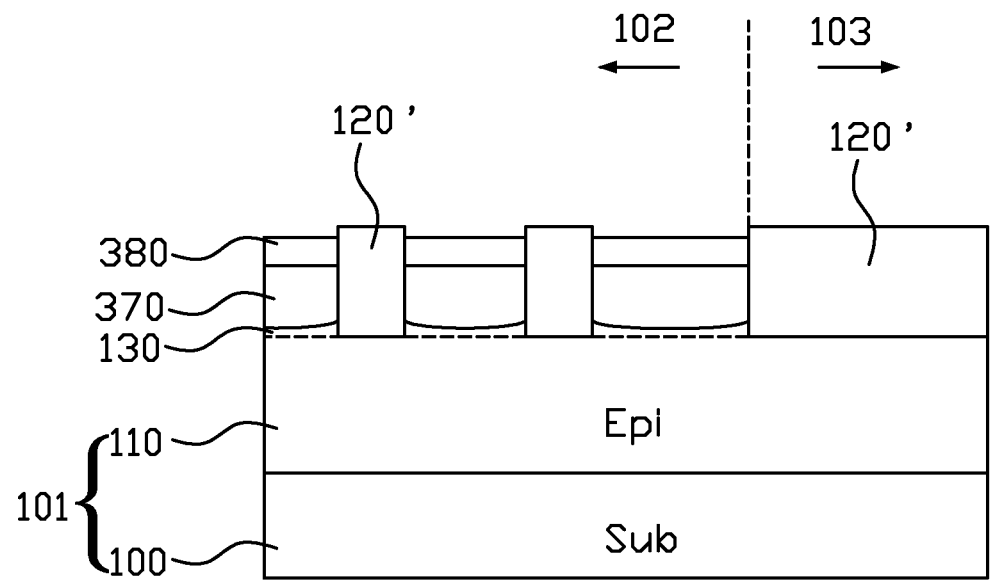
FIG. 3A through the FIG. 3C illustrate the method of manufacturing the trench power semiconductor structure according to the third embodiment of present invention.
Figure 3B:
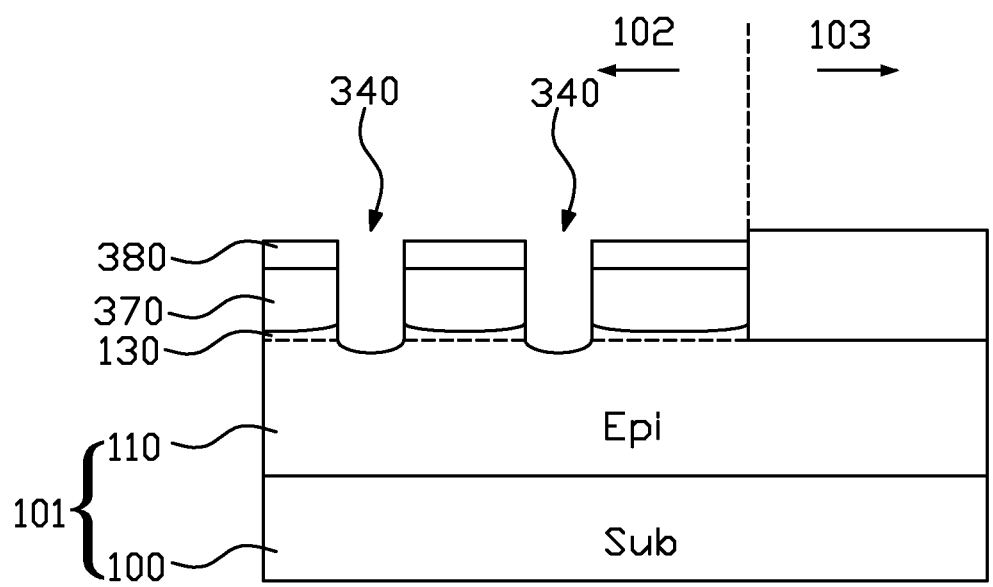
Figure 3C:
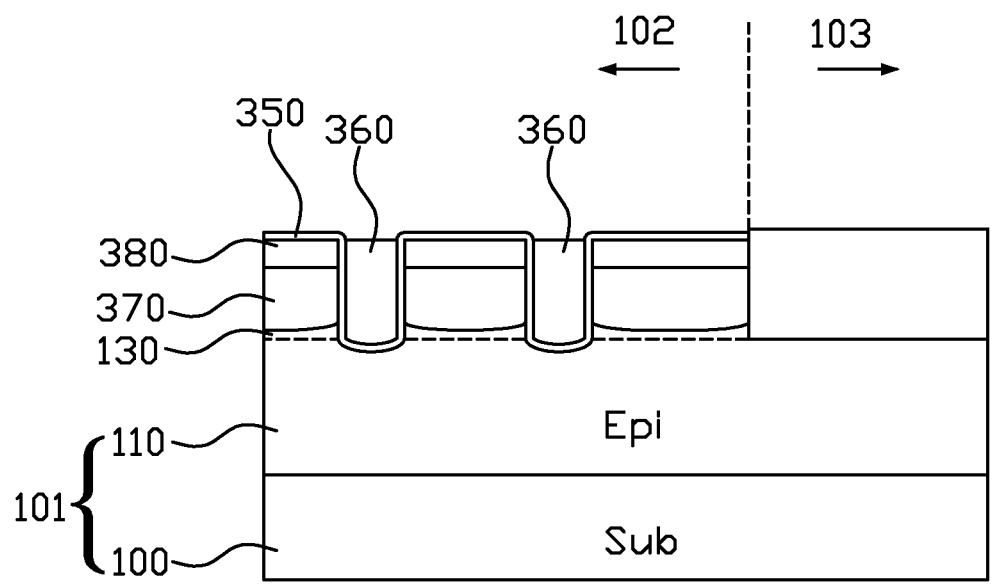

FIG. 3A through FIG. 3C illustrate the method of manufacturing the trench power semiconductor structure according to the third embodiment of present invention. This embodiment is different from the first embodiment in which the source and the body are formed after the gate dielectric layer. Instead, the source and the body are formed before the gate dielectric layer in this embodiment. As shown in the FIG. 3A, which is the step right after the first epitaxial layer 130 formed in the FIG. 1C of the first embodiment, by utilizing the dielectric pattern layer 120' in the active region 102 and in the terminal region 103 as the mask, and by using the ion implantation manner, a body 370 in the first epitaxial layer 130 is formed. After that, a source 380 is formed on the upper portion of the body 370.

Next, as shown in the FIG. 3B, the dielectric pattern layer 120' in the active region 102 is removed to form a gate trench 340 on the epitaxial layer 110. Then, the bottom of the gate trench 340 is rounded. Finally, as shown in the FIG. 3C, a gate dielectric layer 350 is formed on the first epitaxial layer 130 and in the inner surface of the gate trench 340. Then, a gate structure 360 is formed in the gate trench 340.

Fourth Embodiment

Figure 4A:
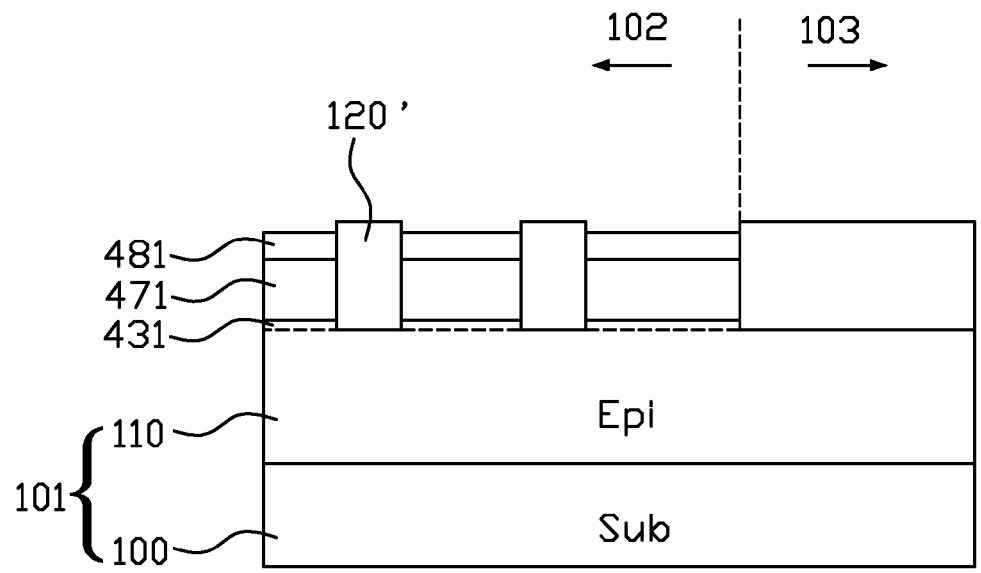
FIG. 4A illustrates the method of manufacturing the trench power semiconductor structure according to the fourth embodiment of present invention.

FIG. 4A illustrates the method of manufacturing the trench power semiconductor structure according to the fourth embodiment of present invention. Being different from the first embodiment which the ion implantation manner is used to form the body and the source, the body 471 and the source 481 in the embodiment are formed by using a selective epitaxial growth manner.

As shown in the FIG. 4A, which is the step right after the dielectric pattern layer 120' is formed in the FIG. 1B of the first embodiment, by utilizing the dielectric pattern layer 120' as the mask, and by using the selective epitaxial growth manner, a first epitaxial layer 431 with the same conductivity type as the base 101 on the epitaxial layer 110 in the active region is formed. Next, by using the selective epitaxial growth manner, a body 471 is formed on the first epitaxial layer 431, wherein the conductivity type of the body 471 is different from that of the first epitaxial layer 431.

Finally, a source 481 is formed on the upper portion of the body 471. The above-mentioned source 481 is formed in the body 471 by using the ion implantation manner or the selective epitaxial growth manner, wherein the thickness of the above-mentioned first epitaxial layer 431 should be larger than that of the gate dielectric layer formed in the following process.

Fifth Embodiment

Figure 4B:
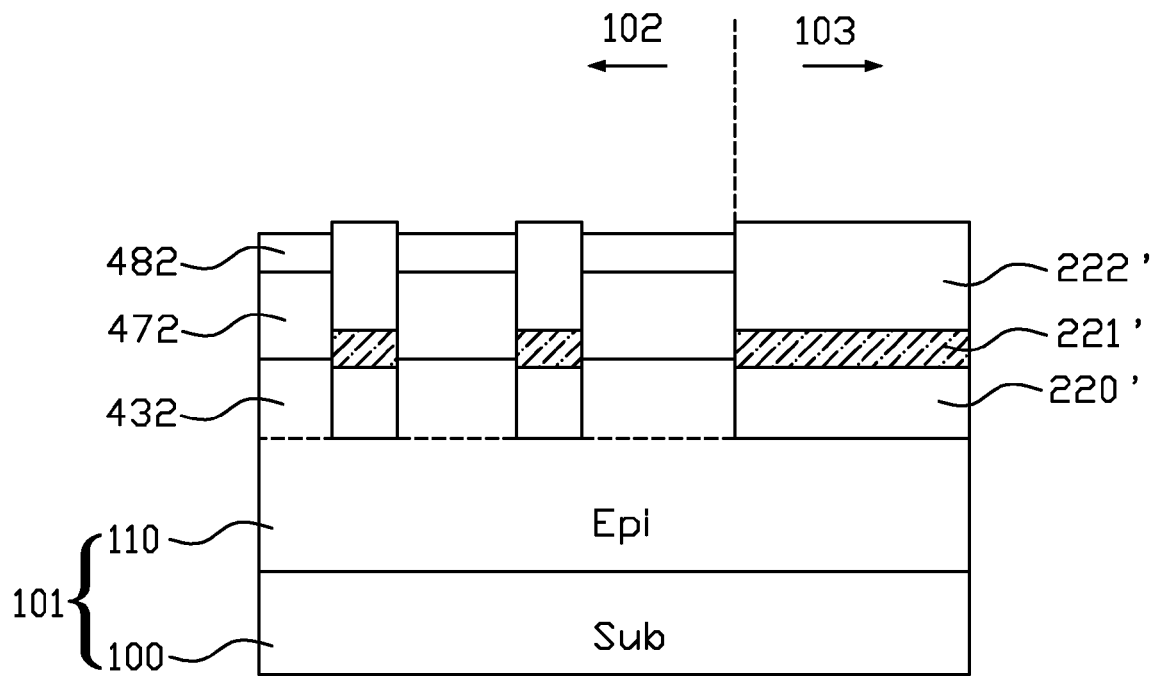
FIG. 4B illustrates the method of manufacturing the trench power semiconductor structure according to the fifth embodiment of present invention.

FIG. 4B illustrates the method of manufacturing the trench power semiconductor structure according to the fifth embodiment of present invention. Being different from the second embodiment which the ion implantation is used, the body 472 and the source 482 in this embodiment are formed by an epitaxial manner. As shown in the FIG. 4B, which is the step right after the dielectric pattern layer is formed in the FIG. 2B of the first embodiment, by utilizing the dielectric pattern layer as the mask, and by using the selective epitaxial growth manner, a first epitaxial layer 432 with the same conductivity type as the base 101 is formed on the epitaxial layer 110 in the active region. What worth to mention is that the thickness of the first epitaxial layer 432 should be larger than that of the bottom dielectric structure 220'.

Next, a body 472 is formed on the first epitaxial layer 432 by using the selective epitaxial growth manner, wherein the conductivity type of the body 472 is different from that of the first epitaxial layer 432. Finally, a source 482 is formed on the upper portion of the body 472.

To sum up, the embodiment of present invention provides a method of manufacturing the trench power semiconductor structure. In the method of manufacturing the trench power semiconductor structure, by using the dielectric pattern layer in the active region and the terminal region, and by using the selective epitaxial growth manner, the first epitaxial layer is formed on the base without being covered by the dielectric layer. Thus, one of the masking processes can be omitted in the process of forming the body and the source, so as to simplify the process of manufacturing the trench power semiconductor.

The above-mentioned is only the embodiment of the present invention, which can't be used to restrict the scope of the present invention.

What is claimed is:

1. A method of manufacturing the trench power semiconductor structure, comprising:
providing a base;
forming a dielectric pattern layer on the base to define an active region and a terminal region, wherein a portion of the base in the active region and the terminal region is covered by the dielectric pattern layer;
selectively forming a first epitaxial layer on the base without being covered by the dielectric pattern layer;
removing the dielectric pattern layer in the active region to form at least a gate trench on the base;
forming a gate dielectric layer in the gate trench and on the first epitaxial layer;
forming a gate structure in the gate trench;
utilizing the dielectric pattern layer in the terminal region as a mask to form a body in or on the first epitaxial layer; and
forming a source on the upper portion of the body.

2. The method of manufacturing the trench power semiconductor structure of claim 1, wherein before the step of forming the gate dielectric layer in the gate trench, the method of manufacturing the trench power semiconductor structure further comprising: etching the bottom of the gate trench.

3. The method of manufacturing the trench power semiconductor structure of claim 2, wherein after the step of etching the bottom of the gate trench and before the step of forming the gate dielectric layer in the gate trench, the method of manufacturing the trench power semiconductor structure further comprising: forming a sacrificial oxide layer inside the gate trench and on the base.

4. The method of manufacturing the trench power semiconductor structure of claim 1, wherein, the body is formed in the first epitaxial layer by using an ion implantation manner.

5. The method of manufacturing the trench power semiconductor structure of claim 4, wherein, the source is formed on the upper portion of the body by using the ion implantation manner.

6. The method of manufacturing the trench power semiconductor structure of claim 1, wherein, the body is formed on the first epitaxial layer by using an epitaxial manner.

7. The method of manufacturing the trench power semiconductor structure of claim 6, wherein, the source is formed on the upper portion of the body by using an ion implantation manner.

8. The method of manufacturing the trench power semiconductor structure of claim 1, wherein, the thickness of the first epitaxial layer is larger than that of the gate dielectric layer.

9. The method of manufacturing the trench power semiconductor structure of claim 1, wherein, the steps of forming the body and the source are proceeded after the step of forming the gate dielectric layer.

10. The method of manufacturing the trench power semiconductor structure of claim 1, wherein, the dielectric pattern layer comprises a bottom dielectric structure, an isolating structure and a shielding structure.

11. The method of manufacturing the trench power semiconductor structure of claim 10, wherein, the thickness of the first epitaxial layer is larger than that of the bottom dielectric structure.

12. The method of manufacturing the trench power semiconductor structure of claim 1, wherein the first epitaxial layer is formed by the selective epitaxial growth manner.

* * * * *